(12) United States Patent
Afshar Mohajer et al.

(10) Patent No.: US 10,875,248 B2
(45) Date of Patent: Dec. 29, 2020

(54) DIGITIZATION AND FABRICATION OF CUSTOM SURFACE TOPOGRAPHIES WITH SUBMICRON RESOLUTION

(71) Applicant: BOARD OF TRUSTEES OF THE UNIVERSITY OF ARKANSAS, Fayetteville, AR (US)

(72) Inventors: Mahyar Afshar Mohajer, Fayetteville, AR (US); Josue Goss, Fayetteville, AR (US); Dipankar Choudhury, Fayetteville, AR (US); Min Zou, Fayetteville, AR (US); Shelby Robert Maddox, Fayetteville, AR (US)

(73) Assignee: Board Of Trustees Of The University Of Arkansas, Fayetteville, AR (US)

( * ) Notice: Subject to any disclaimer, the term of this patent is extended or adjusted under 35 U.S.C. 154(b) by 0 days.

(21) Appl. No.: 16/273,103

(22) Filed: Feb. 11, 2019

(65) Prior Publication Data

US 2019/0248073 A1 Aug. 15, 2019

Related U.S. Application Data

(60) Provisional application No. 62/628,730, filed on Feb. 9, 2018.

(51) Int. Cl.
*B29C 64/30* (2017.01)
*B33Y 50/02* (2015.01)
(Continued)

(52) U.S. Cl.
CPC ............ *B29C 64/30* (2017.08); *B29C 64/393* (2017.08); *B33Y 40/00* (2014.12); *B33Y 50/02* (2014.12); *B33Y 10/00* (2014.12)

(58) Field of Classification Search
None
See application file for complete search history.

(56) References Cited

U.S. PATENT DOCUMENTS

2004/0247732 A1* 12/2004 Walk ............... B29C 33/3842
425/385
2013/0089701 A1* 4/2013 Hooper ............... B23K 26/00
428/131

(Continued)

*Primary Examiner* — Roberts P Culbert
(74) *Attorney, Agent, or Firm* — Keith A. Vogt; Keith A. Vogt, Ltd.

(57) ABSTRACT

The present invention relates generally to methods of fabricating surface topography based on a scanned surface topography. The method converts 3D scanned surface topography data that have submicron resolution to digital formats that can be stored, manipulated, or tiled, and used as an input for replicating the surface topography with submicron resolution on another substrate. The digitized surface topography data is then converted to input for 1) 3D printing to replicate the scanned surface topography with submicron resolution, with or without a subsequent coating layer or layers to impart additional properties and/or features, 2) 3D printing a master that replicates the scanned surface topography with submicron resolution, which will be used for fast replica molding of the surface topography onto another substrate, and 3) creating a photomask with submicron resolution for transferring the surface topography to a metal substrate surface through subsequent photolithography and etching processes.

12 Claims, 20 Drawing Sheets

(51) Int. Cl.
    *B33Y 40/00*     (2020.01)
    *B29C 64/393*     (2017.01)
    *B33Y 10/00*     (2015.01)

(56) References Cited

U.S. PATENT DOCUMENTS

2014/0170377 A1* 6/2014 Hsu .................. F02F 1/20
                                                                           428/141
2017/0024925 A1* 1/2017 Palmer ............... G06T 15/04
2018/0171157 A1* 6/2018 Magin ................ C03C 3/078

* cited by examiner 3D scanning of the natural surface
(used to produce the CAD model)

3D laser lithography of the surface
(printed from the CAD model)

Master surface is printed

MOLD is made — 901

Replicated surface

UV is used to cure the replicated surface

No layer 100 nm layer 200 nm layer 300 nm layer

DIGITIZATION AND FABRICATION OF CUSTOM SURFACE TOPOGRAPHIES WITH SUBMICRON RESOLUTION

RELATED APPLICATIONS

This application claims priority to U.S. Provisional Application No. 62/628,730 filed on Feb. 9, 2019, which is hereby incorporated in its entirety.

STATEMENT REGARDING FEDERALLY SPONSORED RESEARCH & DEVELOPMENT

This invention was made with government support by the National Science Foundation under Grant Number OIA-1457888 and the University of Arkansas. The corresponding campus cost center numbers are 0402 36344-21-1601, 0402 36348-21-1601, 0402 36344-21-1701, 0402 36348-21-1701, and 0112 32222-22-0000, respectively. The government has certain rights in this invention.

INCORPORATION BY REFERENCE OF MATERIAL SUBMITTED ON A COMPACT DISC

Not applicable.

BACKGROUND OF THE INVENTION

Surface topography can affect many surface properties, such as friction, wetting, and optical properties as well as chemical and biological compatibility of the surface. The ability to digitize and fabricate custom surface topographies with submicron resolution to replicate desired micro-/nano-scale features will enable the controlling of surface properties for a wide range of applications. For example, surface textures can improve tribological properties, such as reducing friction, increasing hydrodynamic lifting force, increasing lubricant film thickness for bearings, engine cylinders and artificial joints, storing lubricant under starved or mixed lubrication condition, entrapping wear debris to reduce third-body abrasive wear, reducing flow resistance in pipes or drag in aerodynamic applications, and reducing adhesion between surfaces. Surface texturing can also create superhydrophobic/superhydrophilic surfaces which can enable self-cleaning and providing anti-icing, anti-fogging, and anti-corrosion properties. Surface textures can also change light-surface interactions to provide anti-reflection property as well as change cell-surface interactions to promote cell adhesion or provide antimicrobial property.

Many methods have been used to fabricate surfaces with different topographies for different applications, some of them creating random textures while others creating deterministic textures, For example, in the field of tribology, to reduce friction and wear on metal surfaces, honing, machining or polishing processes have traditionally been used. These methods create limited textures and provide poor dimensional control of the textures. State-of-the-art molten metal spray deposition creates a metal coating with lubricant-retaining pores but offers little control in the design of the pore dimension and shape. Laser surface texturing has been used for creating dimples on surfaces, but the lateral resolutions are generally limited to tens to hundreds of microns. Numerous other methods have also been used for fabricating surface topography with submicron resolution, such as photolithography, scanning beam lithography, molding and embossing, soft pattern transfer, and 2-photon polymerization. However, most of the reported surface textures are 2D, and the geometric parameters such as size, shape, and pitch distance are predefined.

In nature, from millions of years of evolution, many plants and animals have novel 3D micro-/nano-scale surface topographies that enabled them to have many useful properties, such as the slippery and self-cleaning properties of fish skins, the self-cleaning property of lotus leaves, the wear resistant skin of desert scorpion, and the super adhesive property of gecko feet. Therefore, the ability to fabricate or mimic these surface topographies will open the door for many new applications. Currently, soft lithography methods are used to replicate various nature surface topographies. However, only a fixed topography can be replicated from each fabrication process with no freedom to change or modify the topography. The replicating materials are generally soft materials and not durable for real applications.

For practical applications, the desired micro-/nano-scale features may be inspired from natural surfaces that have demonstrated useful properties or from machine component surfaces that have shown desired properties, such as piston rings and cylinders in an engine after the break-in period, or the combination thereof. The ability to not only replicate an existing surface topography with submicron resolution on another substrate surface, but also to modify and combine different desired surface topographical features on one surface is highly desirable and can enable multiple surface properties and new applications. However, there is no prior art that can address this need. Herein, the present invention provides systems and methods of digitization and fabrication of custom surface topographies with submicron resolution that can address these needs.

BRIEF SUMMARY OF THE INVENTION

In one embodiment, the present invention relates generally to methods of fabricating surface topography based on a scanned surface topography. More specifically, it relates to methods of converting 3D scanned surface topography data that have submicron resolution to digital formats that can be stored, manipulated, and used as an input for replicating the surface topography with submicron resolution on another substrate. The digitized surface topography data is then converted to input for 1) 3D printing to replicate the scanned surface topography with submicron resolution, with or without a subsequent coating layer or layers to impart additional properties and/or features, 2) 3D printing a master that replicates the scanned surface topography with submicron resolution, which will be used for fast replica molding of the surface topography onto another substrate, and 3) creating a photomask with submicron resolution for transferring the surface topography to a metal substrate surface through subsequent photolithography and wet etching processes.

In other embodiments, the present invention combines advanced surface metrology to digitize surface topography with submicron resolution with advanced fabrication techniques that include additive manufacturing, photolithography, replica molding, and wet and dry etching to enable both bottom up and top down surface topography fabrication with submicron resolution. With these combinations, one can fabricate and modify scanned surfaces with arbitrary micro-/nano-scale topography on a wide range of substrate materials, such as glass, silicon, metal, ceramic, and polymer.

In other embodiments, the present invention enables 3D scanning of a surface of interest with submicron resolution, digitally storing and manipulating the surface topography data, turning the scanned or modified surface topography data into a printable format, and replicating the scanned or modified surface topography with submicron resolutions on another substrate by 3D printing and subsequent processing steps, such as replica molding, photolithography, and etching.

In other embodiments of the present invention, digitally stored files may be further processed digitally to enhance the properties of the printed surface.

In other embodiments, the present invention may be used with a variety of engine materials, such as cast iron, aluminum, steel, and bronze, on curved surfaces, and fabricating micro-/nano-scale topography at a larger scale for potential tribological applications in automotive industry.

In other embodiments, the present invention may be used to apply surface textures to remove the engine break-in period for enhancing engine efficiency and performance.

In other embodiments of the present invention, the method comprises the steps of: 1) digitize and analyze the surface topography of a sample and identify features of interest or of significance for friction and wear reduction, 2) translate measured surface data to 3D printable data and develop a 3D printing process to fabricate the measured or CAD designed surface topography using a UV-sensitive polymer, and 3) develop processes to fabricate recessed pockets on metallic substrate through selective wet etching.

In other embodiments, the present invention enables surface fabrication based on a custom design with 200 nm lateral resolution. This capability can be used to fabricate surfaces similar to those after engine break-in process and therefore allow the engine break-in process to be skipped to achieve lower component friction and wear and thus improve fuel economy and prolong component life.

In other embodiments, the present invention concerns replicating a scanned surface topography on another substrate with submicron resolution. The methods can be applied to mechanical surfaces to improve oil wettability and lubrication and thus reduce friction and wear of the surfaces. Industrial products such as automotive components or machine parts that are subjected to friction and wear can benefit from the present invention by having micro to nanoscale textures applied on one or both of the mating surfaces, reducing wear and friction and increasing part life.

In other embodiments, the present invention can also be applied to a wide range of other applications where surface micro-/nano-structure can change surface properties, such as wetting, self-cleaning, anti-corrosion, anti-icing, and optical properties.

In other embodiments, the present invention concerns methods of replicating a measured surface topography on another substrate with submicron resolution that may be applied to: Machine parts: valves, cams, bearings, mechanical seals, hinges, coveryor system components, or any component that is designed to move in contact with another part under an applied load; Automotive parts: engine cylinder liners, cylinder bore, bearings, valve components, gears, transmission components; Biomedical implants: implant surfaces such as dental, knee or hip joints; and Extraterrestrial machine: moving parts located inside satellites, rockets, and launched vehicles and objects.

In other embodiments, the present invention can also be applied to a wide range of other applications where surface micro-/nano-structure can change surface properties, such as wetting, self-cleaning, anti-corrosion, anti-icing, and optical properties.

In other embodiments, the present invention can also be used to digitize a surface with submicron resolution, i.e., measure the topography of a surface and save the measured surface topography in a digital file. The digitized surfaces can be stored in a database for multiple uses. The digitized surfaces are scalable, flexible, and can be easily modified and used to fabricate surface features with arbitrary 3D shapes.

In other embodiments, the present invention can be used to fabricate surfaces with topographical feature size down to 140 nm.

In other embodiments, the present invention can be used to fabricate a micro-/nano-scale surface topography on different types of substrate material.

The embodiments of the present invention may also be used alone or in conjunction with a coating or coatings to improve surface properties, such as wetting, friction, wear, corrosion, and optical properties.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

FIG. 16 is not toroidally continuous, there are discontinuities at the edges of the images.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

Figure 1:
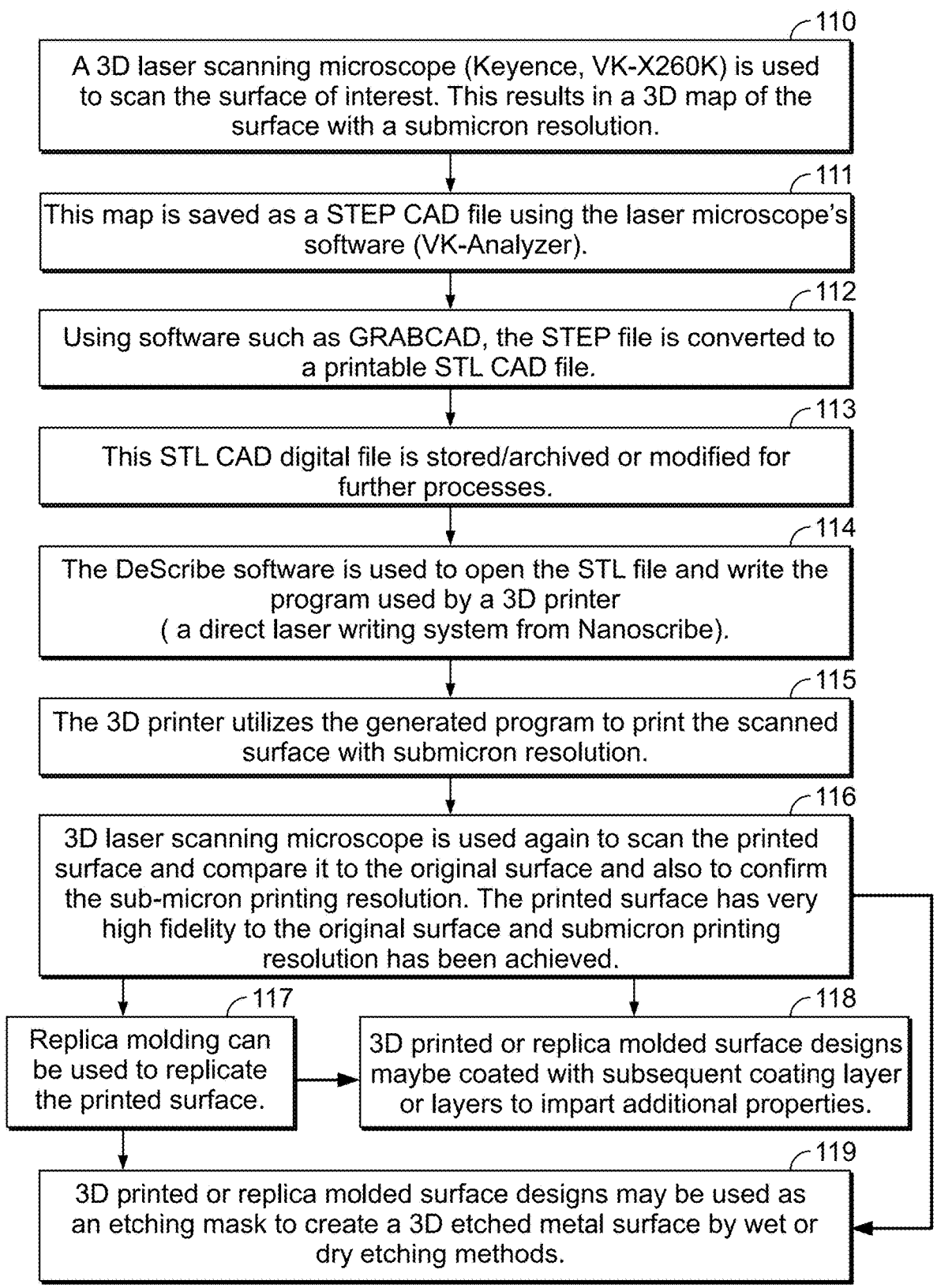
FIG. 1 depicts the process steps of 3D digitization, digital storage, and 3D printing using direct laser writing and replication of 3D surfaces with submicron resolutions for an embodiment of the present invention and/or which involves large area tilting.

One embodiment of the present invention, the process steps of 3D digitization, digital storage and 3D printing using direct laser writing and replication of 3D surfaces with submicron resolutions are illustrated in FIG. 1. The following are detailed descriptions of each step.

Figure 2:
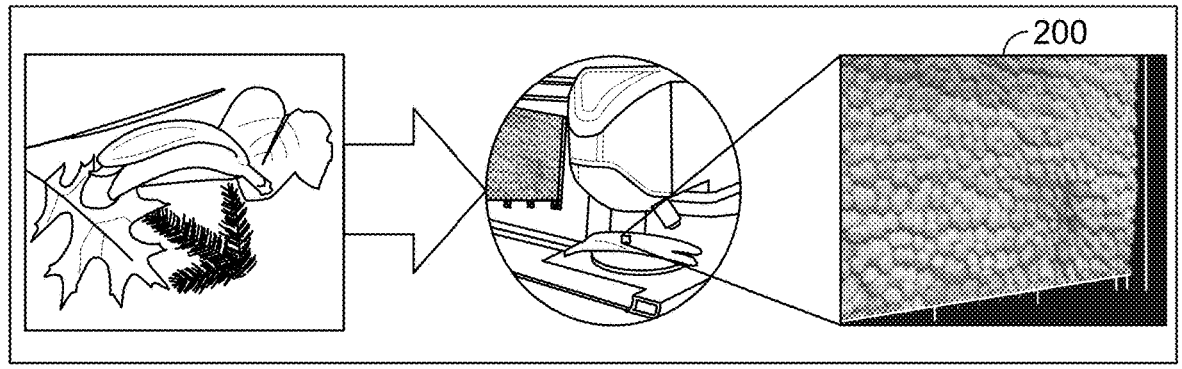
FIG. 2 depicts a high-resolution 3D scanning of the surface.

Step 110: A 3D laser scanning microscope (Keyence, VK-X260K) may be used to scan the surface of interest. This results in a 3D map 200 of the surface with a submicron resolution as shown in FIG. 2. Depending on the desired resolution, different lenses can be used for scanning i.e., 20×, 50×, 150×, etc. Depending on the desired quality of the scanned surface topography, standard or superfine measurement modes can be used. Depending on the desired resolution, different scanning Z pitches can be used ranging from 0.01 μm to 50 μm (higher magnification lenses provide finer pitches). The file may be stored with .vk4 extension or other format.

Step 111 provides that the scanned 3D map (200 as illustrated in FIG. 2) is saved as a STEP CAD file using the laser microscope's software (VK-Analyzer). The software's "output 3D-CAD data" function may be used to convert .vk4 file to a CAD file. When exporting, a "skip amount" between 1 (no skip) and 32 may be chosen. The larger the skip amount, the more data is lost in the conversion process which means lower fidelity to the original scanned surface. The smaller the skip amount, the higher the resolution and fidelity to the original scanned surface. However, the file size increases. The software can be used to trim the original scanned surface so that a specific area of the scanned surface is chosen for further processing. The software can also be used to process the scanned surface prior to conversion to CAD file to improve the quality of the surface by e.g., noise elimination, tilt correction, smoothing, etc.

Figure 3:
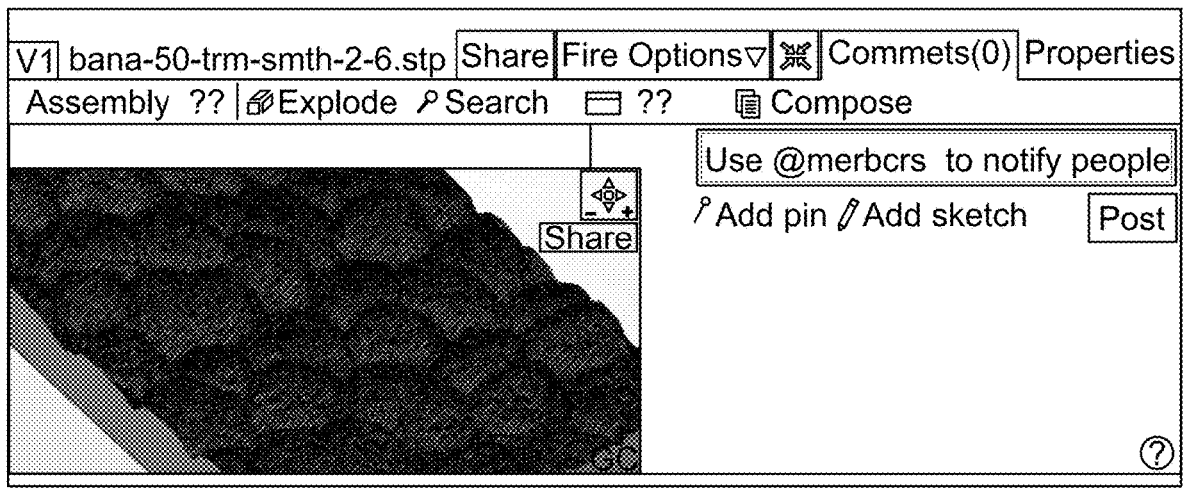
FIG. 3 depicts a software process for converting to a printable STL file for an embodiment of the present invention.

Using software such as GRABCAD, the STEP file may be converted to a printable STL CAD file as shown in FIG. 3 as shown in Step 112. Once STEP file is opened, it may be downloaded as a STL file.

This STL CAD digital file is stored/archived or modified for further processes as provided in Step 113.

Figure 4:
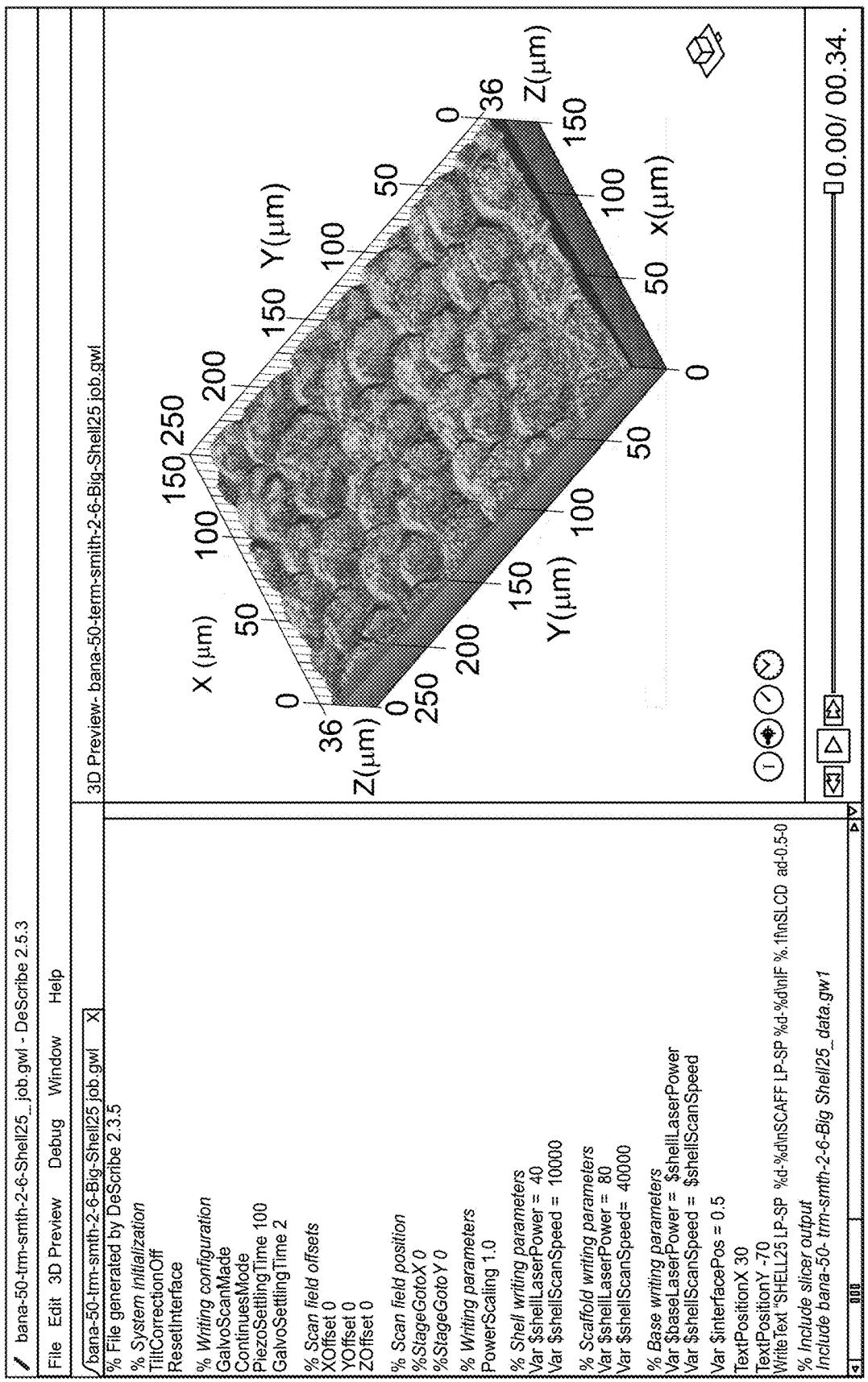
FIG. 4 depicts how software may be used to open the STL file and write the program used by direct laser writing (two-photon polymerization) 3D printer for an embodiment of the present invention.
Figure 5A:
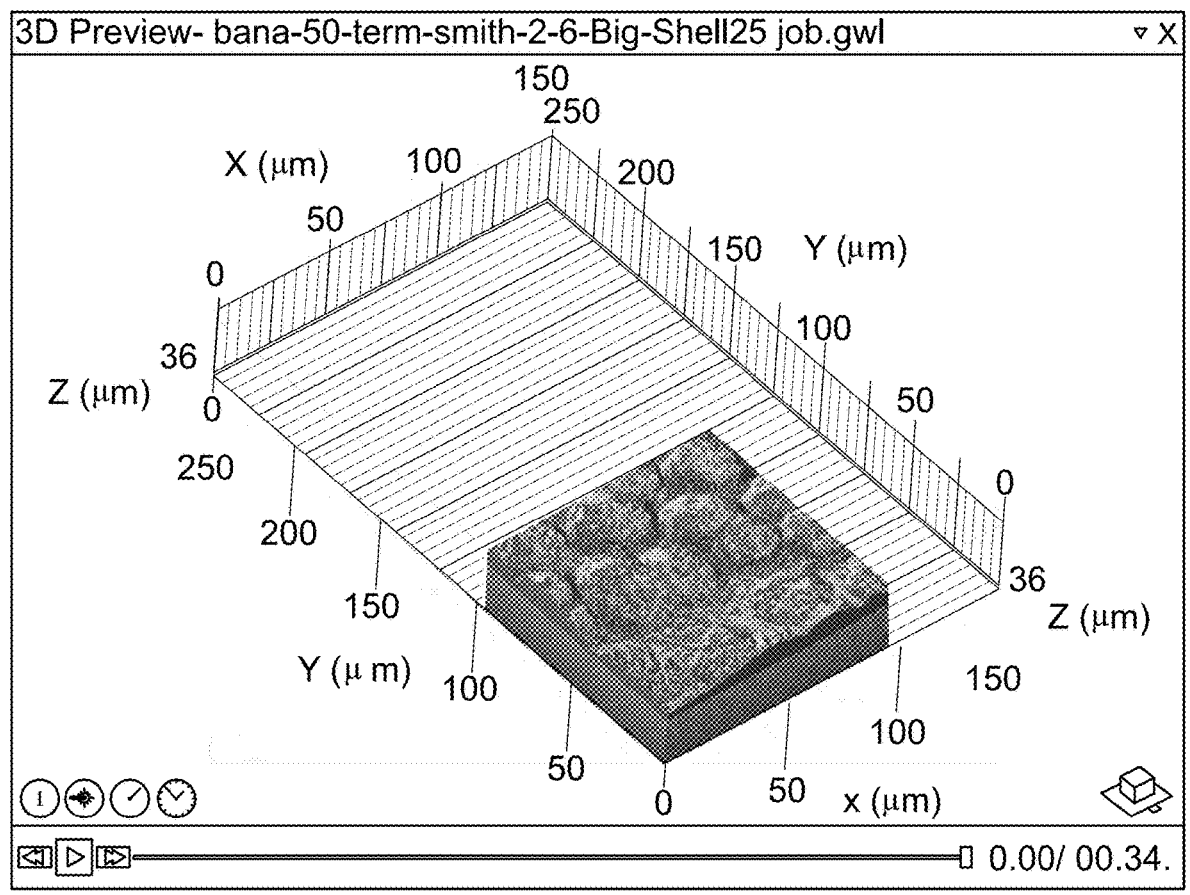
FIGS. 5A, 5B, 5C, 5D, 5E and 5F show a visualization of a stitching and printing process for an embodiment of the present invention.
Figure 5B:
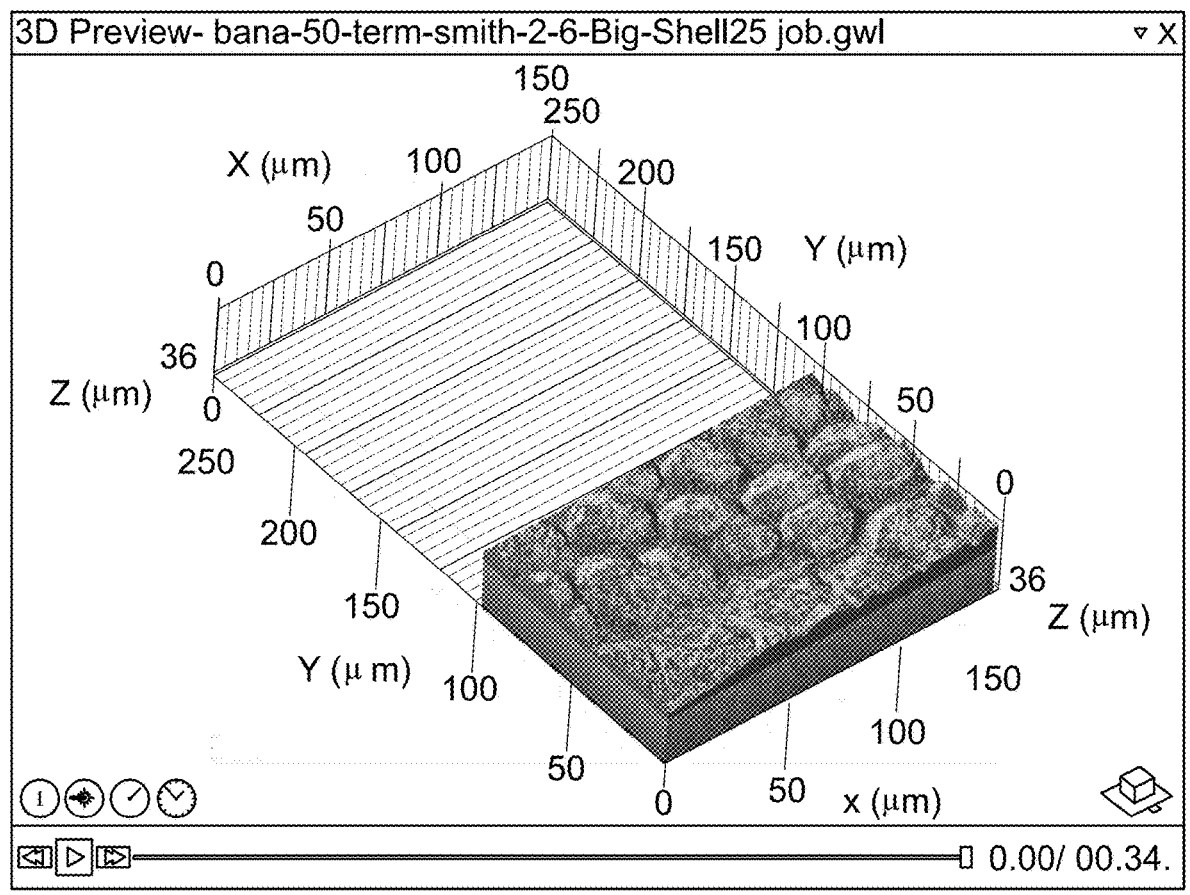
Figure 5C:
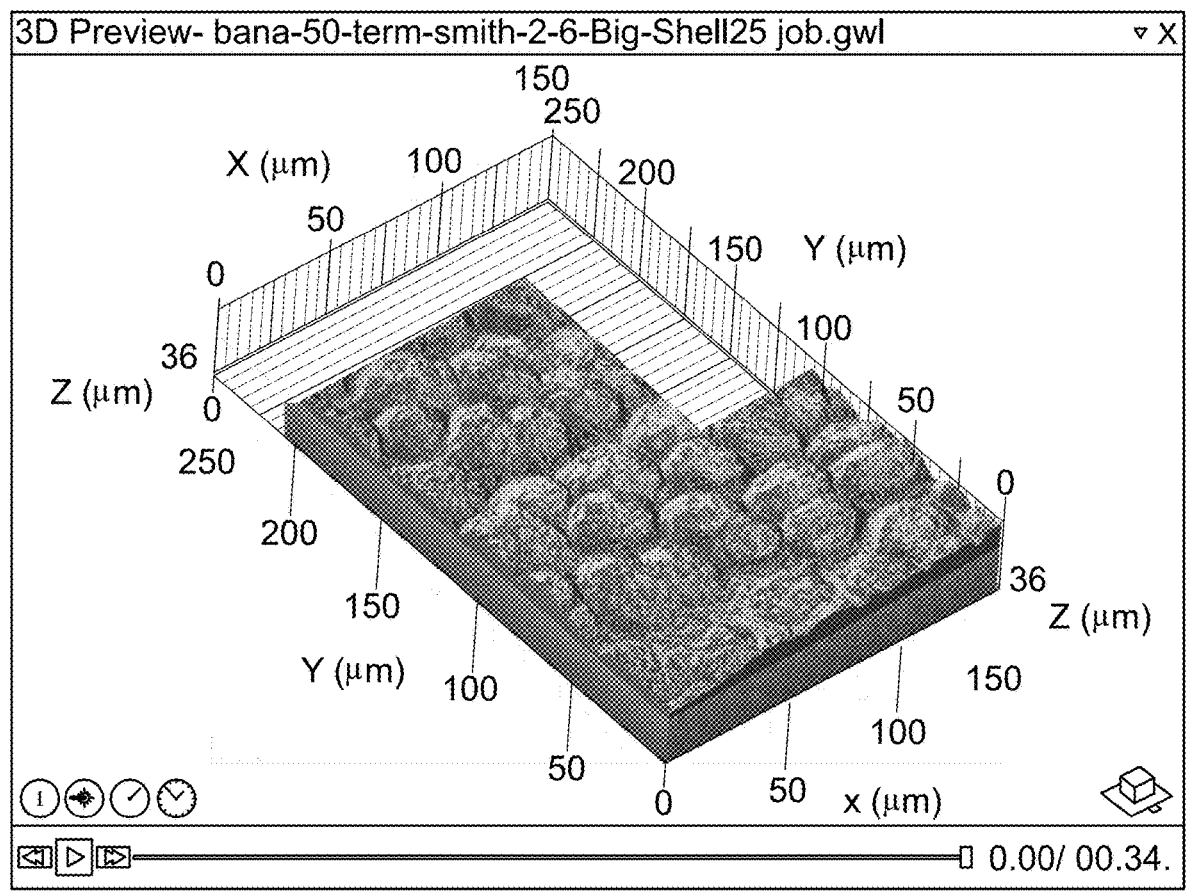
Figure 5D:
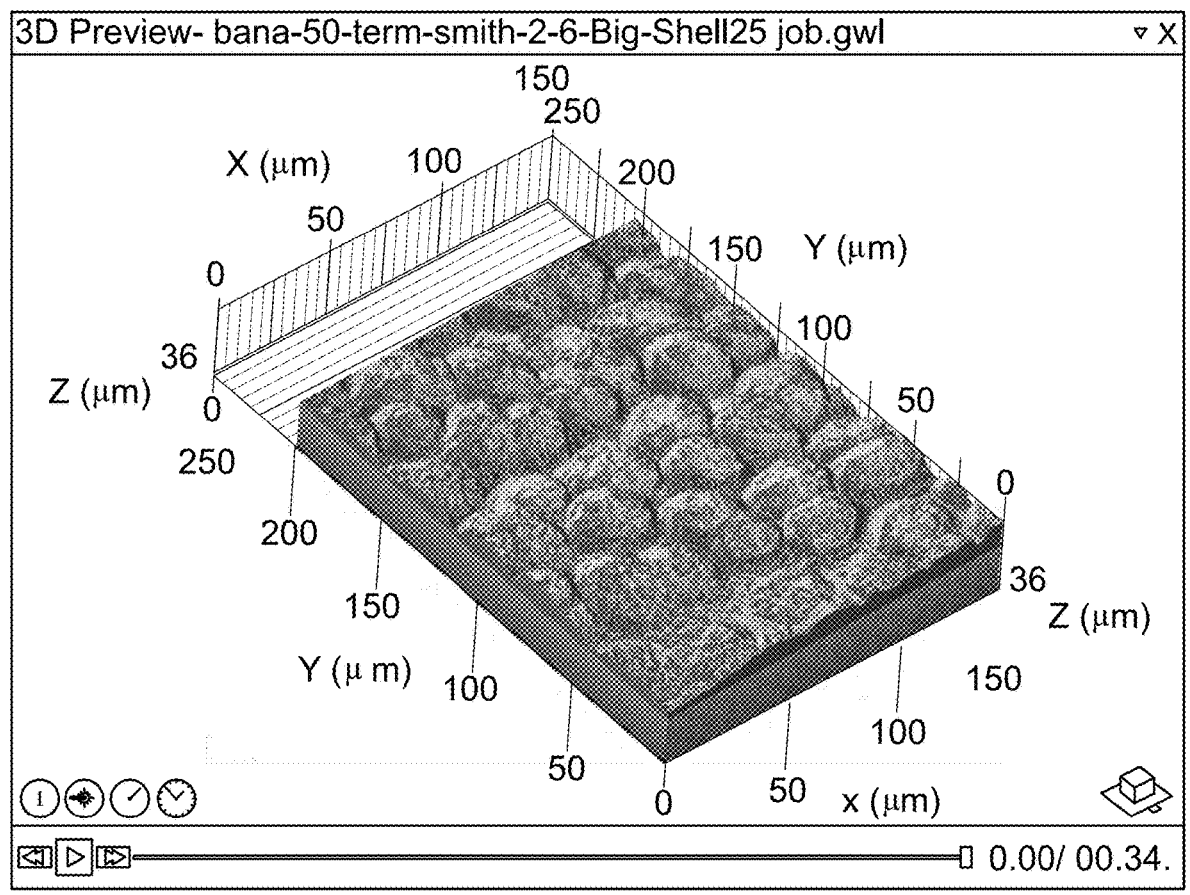
Figure 5E:
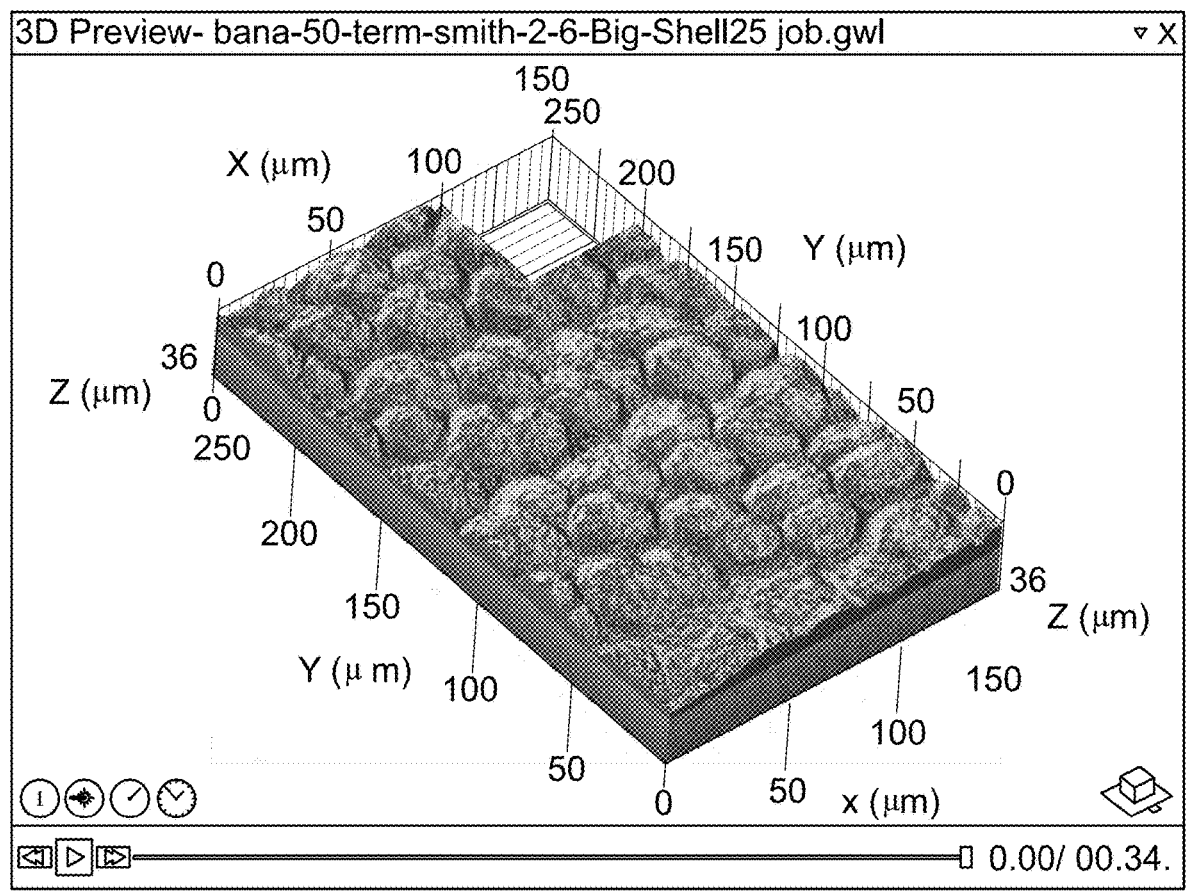
Figure 5F:
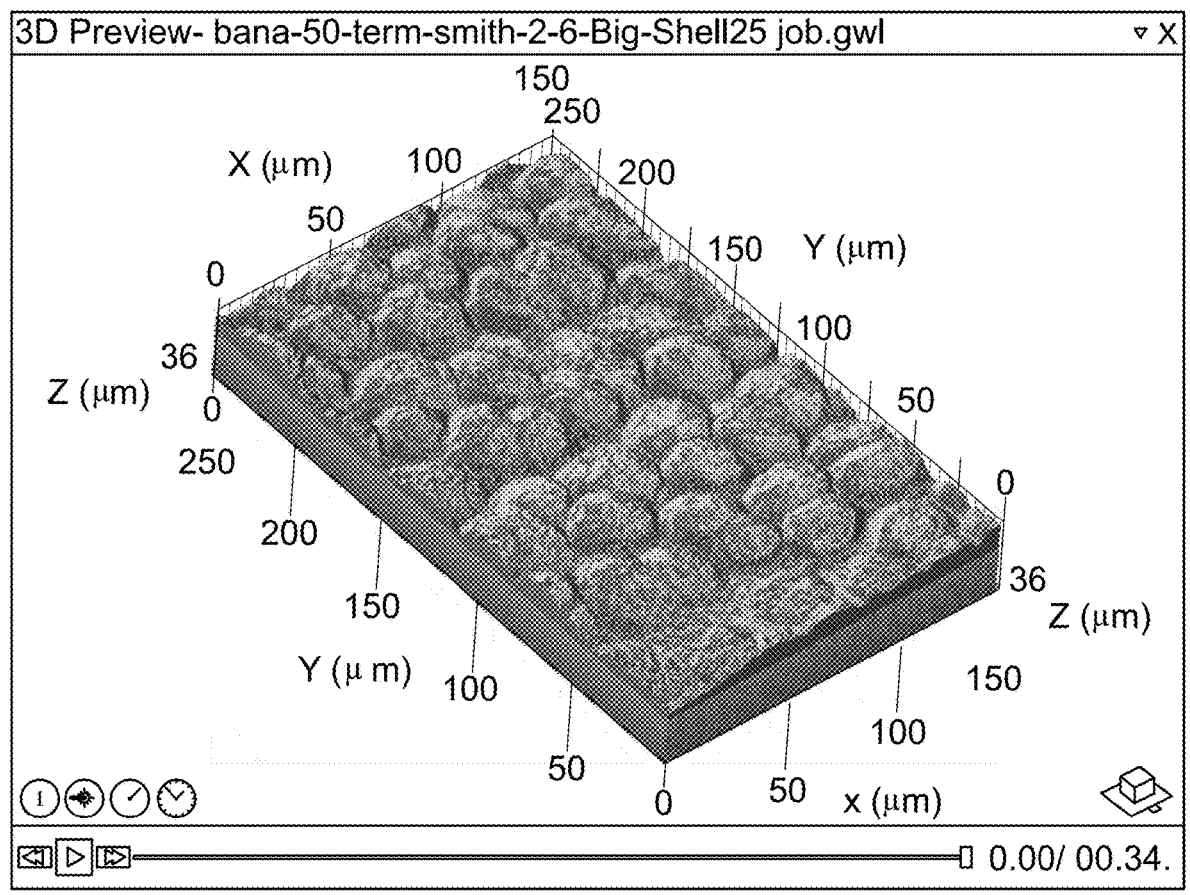

The DeScribe software may be used to open the STL file and write the program used by a 3D printer (a direct laser writing system from Nanoscribe) as shown in FIG. 4. This step is illustrated in Step 114. Depending on the desired resolution, the programming can be done for a specific writing lens, i.e., 25× or 63×. 63× provides a higher printing resolution. Slicing distance (distance between the printed layers) is chosen based on the desired resolution and the lens chosen, e.g., from 200 nm to 2 μm. Depending on the desired resolution, hatching distance is chosen. It is the distance between scanned laser lines while printing. If needed, solid printing can be combined with scaffold printing and contour printing. Scaffold printing saves time by printing the bulk parts of the model as scaffolds rather than solids. Contour printing increases the accuracy of outer lines of the model by following the exact line profile. Depending on the size of the model being printed and the limit on the printing field of the writing lens, stitching while printing might be required. For example, the printing field of the 63× lens is a 140×140 μm square, and anything bigger than that being printed must be split into smaller areas which are printed side by side. The individual blocks being printed can be overlapped for a few microns so that they are fully connected. Moreover, printing the block boundaries at an angle (e.g., from 10-30 degrees) may be used to improve the stitching quality. An example of software visualizing the stitching and printing process is shown in FIGS. 5A-5F. Laser power and writing speed must be specified in the program depending on parameters such as the photoresist that is being used, i.e., IP-DIP, IP-L, IP-S, IP-G, and SU8, etc. A variety of combinations of laser power and writing speed can be used. For example, for IP-DIP, a possible range of laser power for printing can be from 40 to 80 and a possible range of writing speed can be from 10000 to 40000 in the Nanoscribe laser parameter setting. The job may be saved as a .gwl file.

Figure 6:
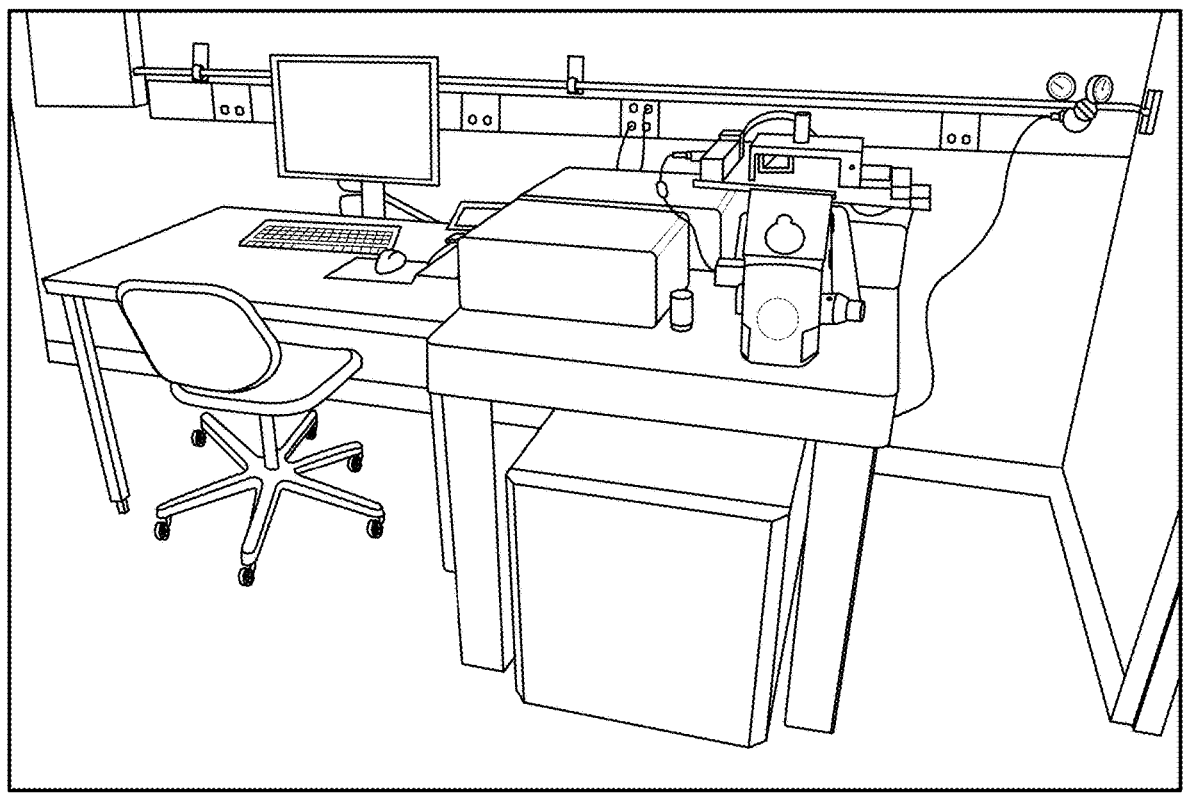
FIG. 6 depicts a Nanoscribe two-photon polymerization system for an embodiment of the present invention.

Step 115: An additive manufacturing system that has submicron resolution (Nanoscribe shown in FIG. 6) utilizes the generated program to print the scanned surface. System preparation before printing involves installing the right lens as decided before programming based on the desired resolution, placing the photoresist of choice on the substrate and mounting the substrate on the machine and starting the NanoWrite software. NanoWrite software takes as input the program generated in the previous step and prints it into the photoresist based on two-photon polymerization.

Step 116: the 3D laser scanning microscope may be used again to scan the printed surface and compare it to the original surface and confirm the submicron printing resolution. The printed surface has very high fidelity to the original surface and submicron printing resolution is achieved. "Compare" function in the laser scanning microscope's software may be used to compare the printed surface to the original surface as shown in FIGS. 7A-7C.

In one application of the present inventions, a banana peel with micro-/nano-scale features was scanned, digitized and printed. The printed surface was compared to the original surface quantitatively, and the printed surface proved to have high fidelity to the original surface as shown in FIGS. 7A-7C.

Figure 7A:
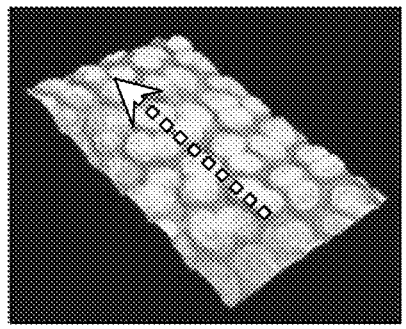
FIGS. 7A, 7B and 7C are a comparison of the printed surface to the original surface showing the high fidelity of the printed surface to the scanned surface for an embodiment of the present invention.
Figure 7B:
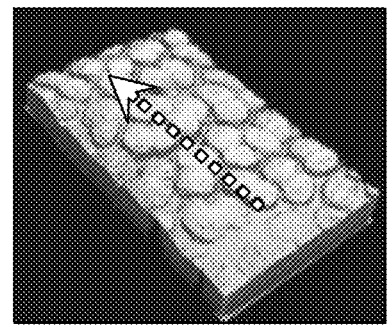
Figure 7C:
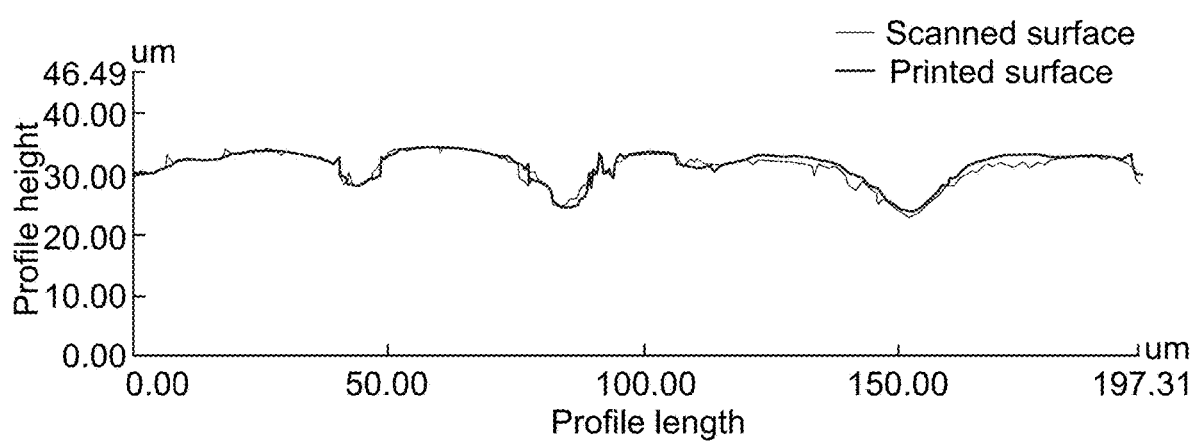
Figure 8:
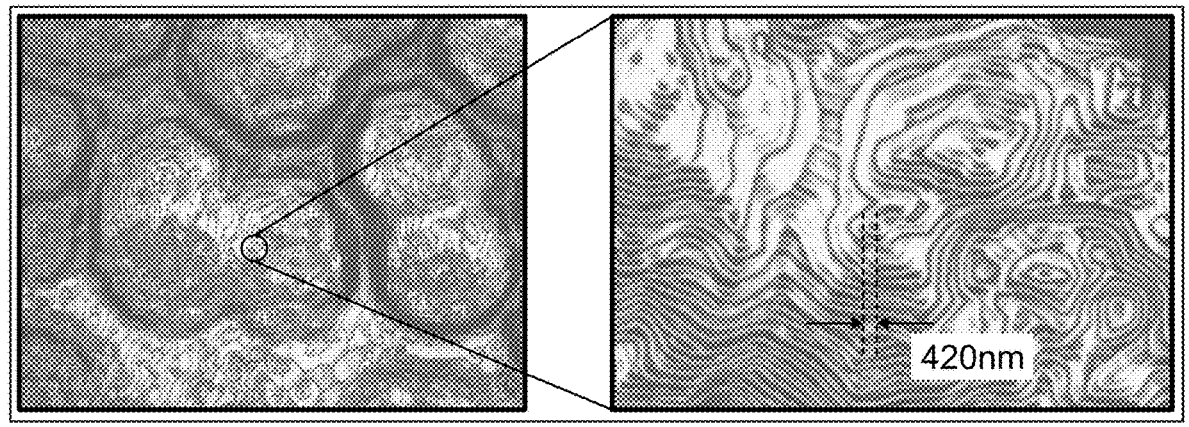
FIG. 8 is a top view of a selected portion of the printed surface for an embodiment of the present invention.

FIG. 7A shows the 3D scanning of the natural surface, which is the original surface used to produce the CAD model. FIG. 3B shows 3D scan of the surface printed from the CAD model using 3D laser lithography. The difference between the profiles of the scanned surface and the printed surface is compared and illustrated in FIG. 7C. Laser scanning microscope may be used to confirm the submicron printing resolution as shown in FIG. 8. The resolution of the measured and printed surfaces has been demonstrated to be submicron as shown in FIG. 8.

Figure 9A:
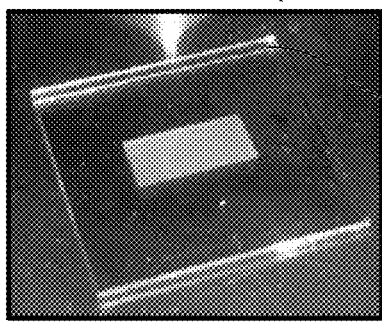
FIGS. 9A, 9B, 9C-9D depict the steps of a replica molding process for an embodiment of the present invention.
Figure 9B:
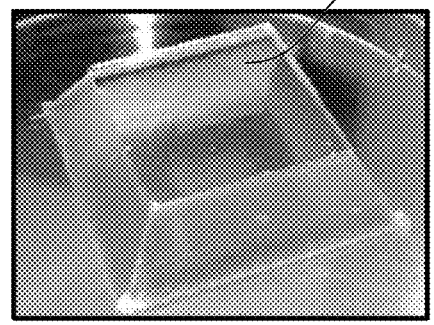
Figure 9D:
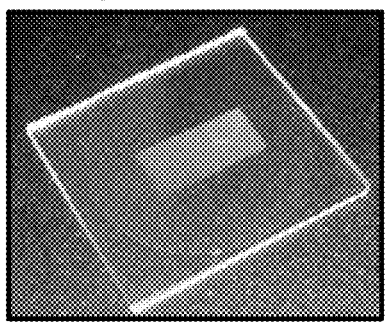
Figure 9C:
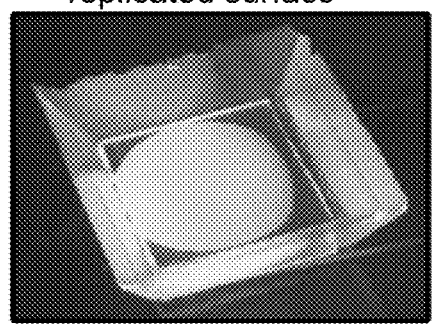

Step 117: Replica molding may be used to replicate the printed surface. A PDMS mold 901 is made by placing the printed master 900 inside a holder/container, pouring uncured PDMS over the printed surface until its fully covered and curing the PDMS as shown in FIGS. 9A-9D. The printed surfaces were used as a master to fabricate a PDMS mold for replica modeling to replicate the printed surface at a high throughput as shown in FIGS. 9A-9D. Once the PDMS is fully cured, it is detached from the printed master surface. To replicate the molded pattern, a photoresist is applied to the surface of the substrate, the PDMS mold is positioned against the photoresist, and a gentle force is applied to the mold. While the mold and photoresist are in contact (as shown in FIG. 9C), the appropriate curing of the photoresist is performed, e.g., UV curing in the case of a photoresist like IP-DIP or a combination of sequential heat and UV curing in the case of a photoresist like SUB. After the photoresist is cured, the PDMS mold is removed, and the inverse or negative pattern of the mold is transferred to the cured photoresist. Such fabrication methods allow for the replication of shapes with lateral resolution as small as 80 nanometers and vertical resolutions as small as 50 nanometers. Using the described method, one master is printed and a PDMS mold of the master is made to replicate surfaces in a matter of minutes using UV exposure of the material through the mold.

Figure 10A:
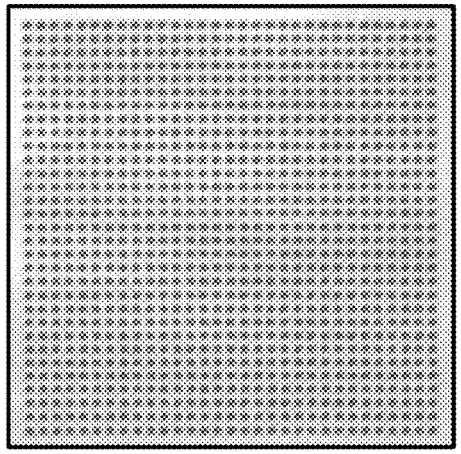
FIG. 10A shows a submicron dot array (30×30).
Figure 10B:
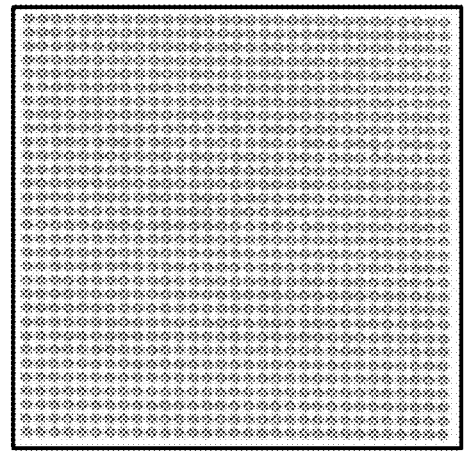
FIG. 10B shows a submicron dot array (30×30) with an aluminum coating layer of 100 nm in thicknesses.
Figure 10C:
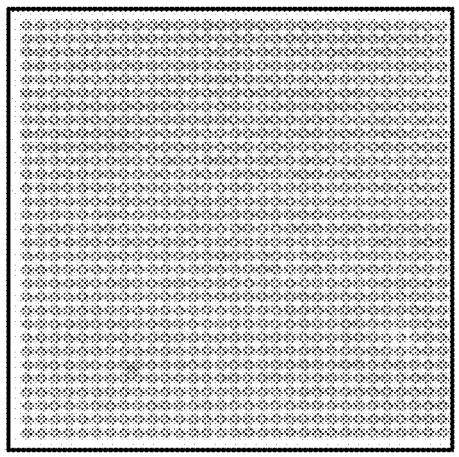
FIG. 10C shows a submicron dot array (30×30) with an aluminum coating layer of 200 nm in thicknesses.
Figure 10D:
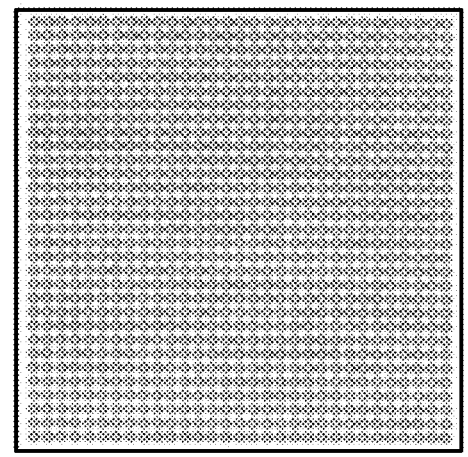
FIG. 10D shows a submicron dot array (30×30) with an aluminum coating layer of 300 nm in thicknesses.

Step 118: 3D printed, or replica molded surface designs may be coated with a subsequent coating layer or layers as shown in FIGS. 10B-10D to impart additional properties as shown in FIGS. 11A-11C and 12.

FIG. 10A provides the submicron dot arrays (30×30 μm) with no alumina coating layer. FIG. 10B shows a submicron dot array (30×30 μm) with an aluminum coating layer of 100 nm in thicknesses. FIG. 10C shows a submicron dot array (30×30 μm) with an aluminum coating layer of 200 nm in thicknesses. FIG. 10D shows a submicron dot array (30×30 μm) with an aluminum coating layer of 300 nm in thicknesses.

Figure 11A:
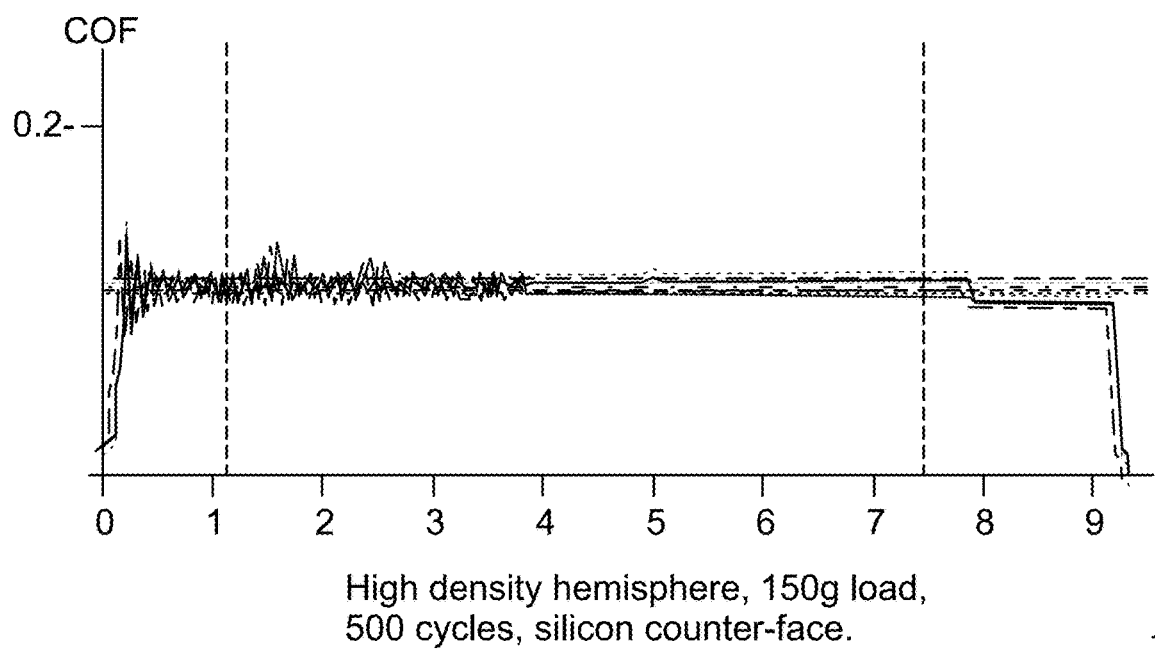
FIGS. 11A, 11B and 11C show friction and wear testing for surfaces made in accordance with an embodiment of the present invention.
Figure 11B:
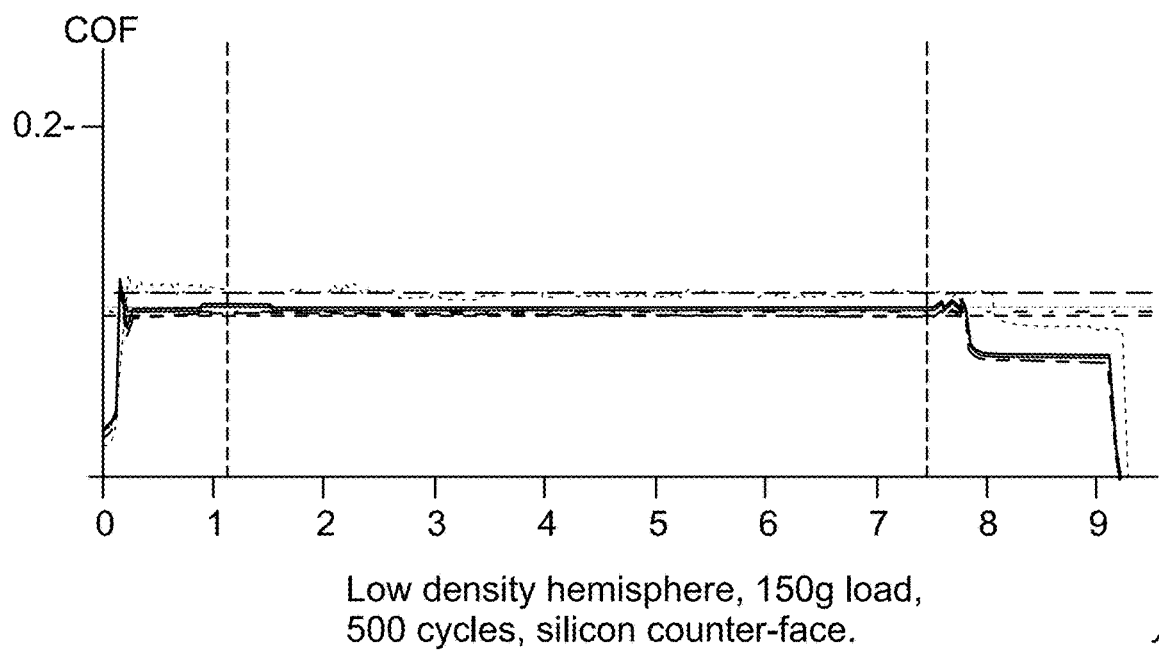
Figure 11C:
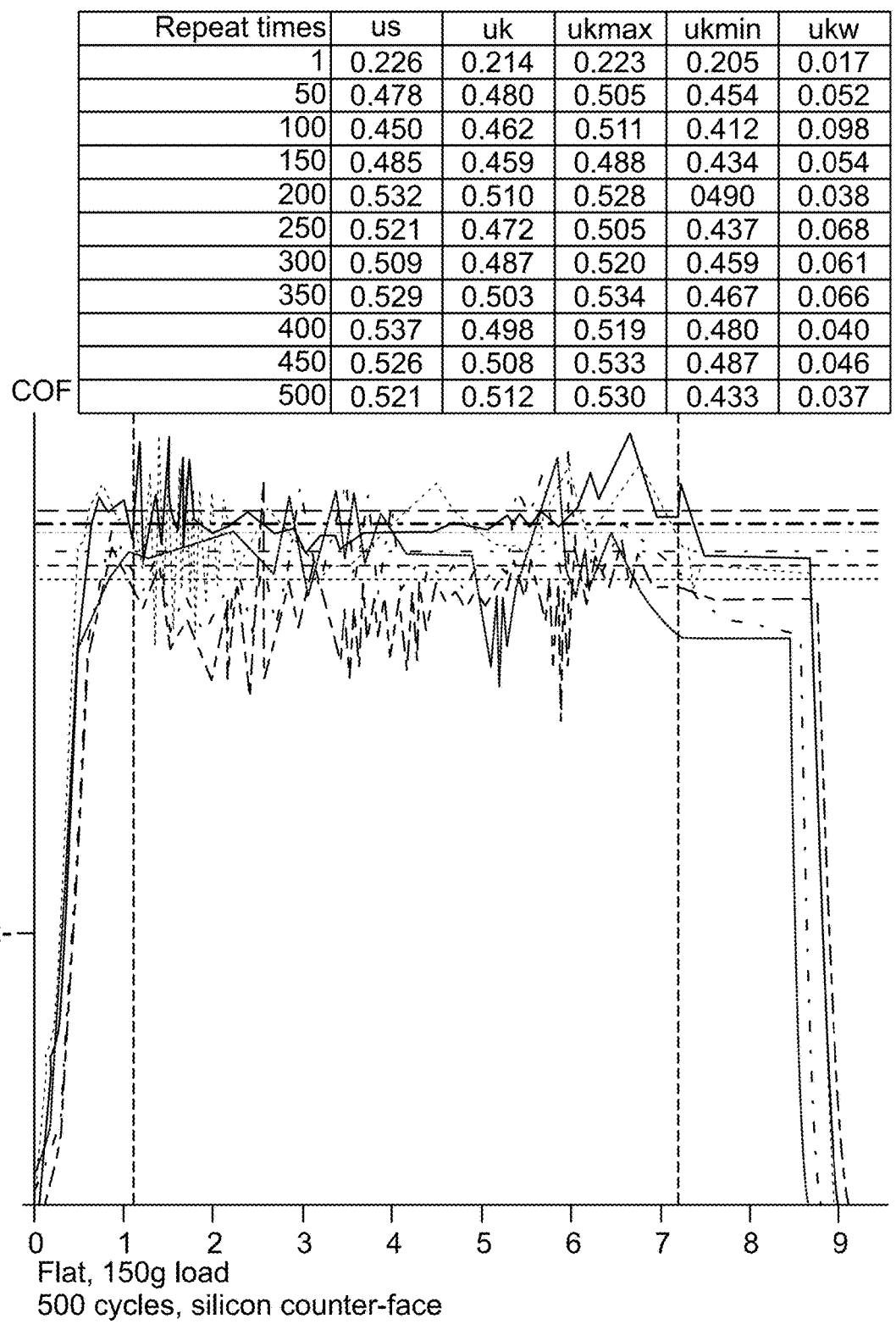

FIGS. 11A-11C show friction and wear testing for surfaces made in accordance with an embodiment of the present invention.

Figure 12:
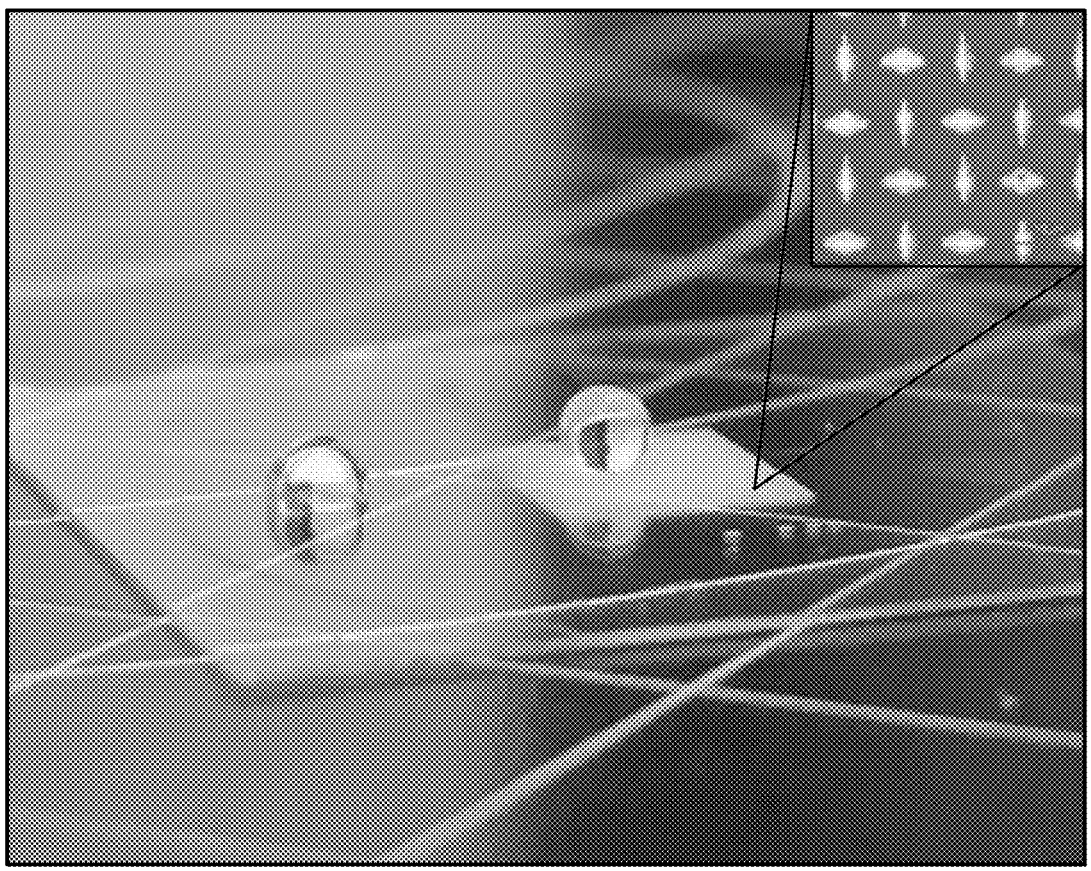
FIG. 12 shows the effect of surface textures and surface wettability for surface made in accordance with the embodiment of the present invention.

The effect of surface textures on the surface wettability has been demonstrated in FIG. 12 using a printed surface.

Friction and wear testing were performed on textured and un-textured surfaces and the textured surfaces showed more than 80% reduction in coefficient of friction and longer durability as shown in FIGS. 11A-11C. The effect of surface textures on the surface wettability has been demonstrated using a printed surface as shown in FIG. 12.

Figure 13:
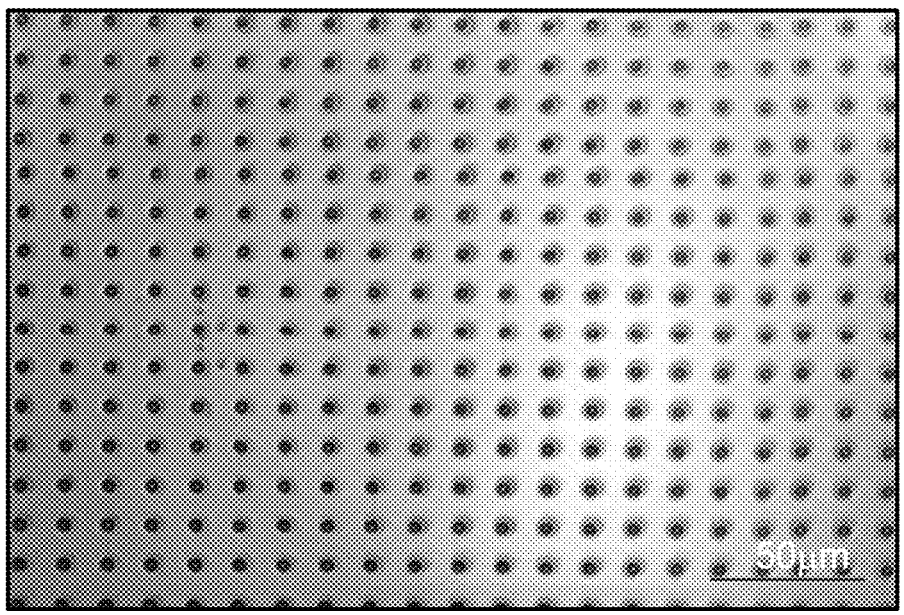
FIG. 13 shows how a printed surface was used as a photomask for exposing part of the surface area for wet chemical etching to transfer the surface topography to metallic substrates.
Figure 14:
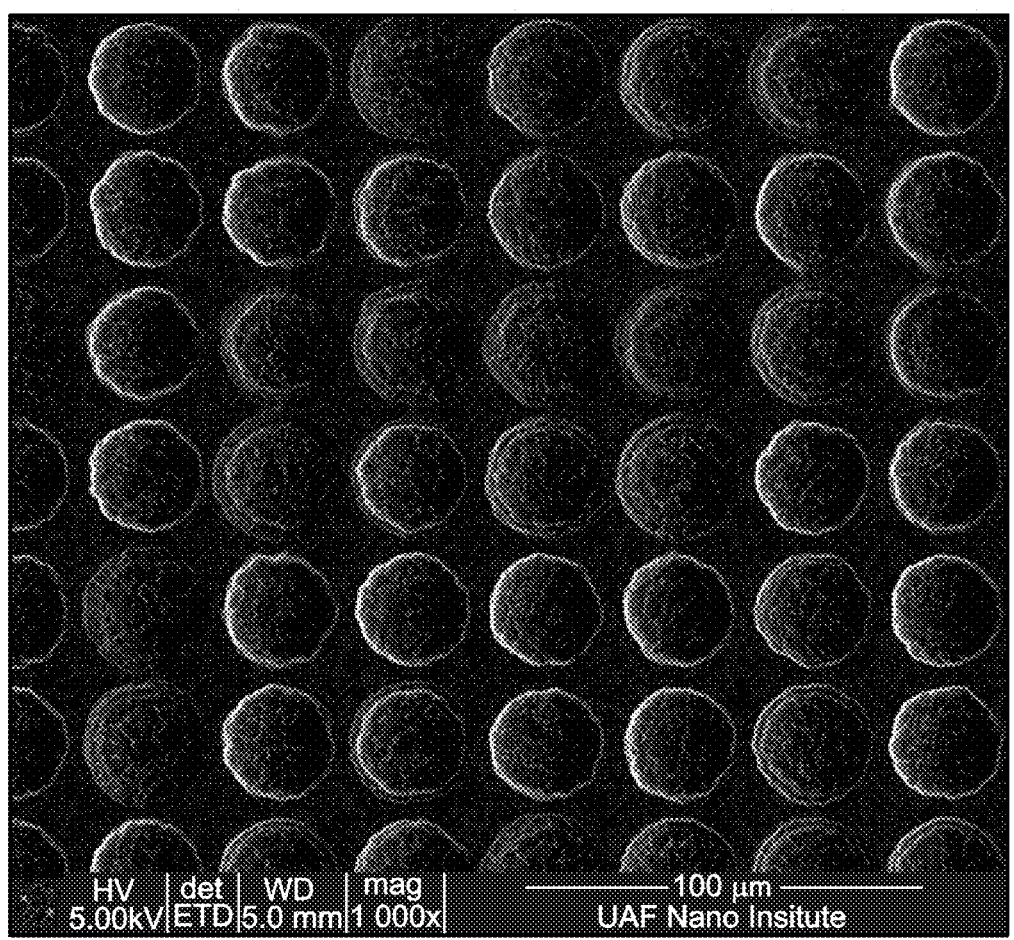
FIG. 14 depicts recessed textures on titanium alloy were fabricated by selective wet etching after photolithography through the 3D printed mask.

Step 119: 3D printed, or replica molded surface designs may be used as an etching mask as shown in FIG. 13 to etch desired topography to a substrate to create a 3D etched metal surface as shown in FIG. 14 by wet or dry etching methods.

The substrate described in step 119 may be an automotive component. It may also be an engine part, replicated image reduces a break-in period for the engine part.

Furthermore, printed surfaces were used as photomasks to expose part of the surface area for wet chemical etching for transferring the surface topography to metallic substrates as shown in FIG. 13. Wet etching process has been developed to fabricate recessed textures on titanium alloy as shown in FIG. 14.

Figure 15:
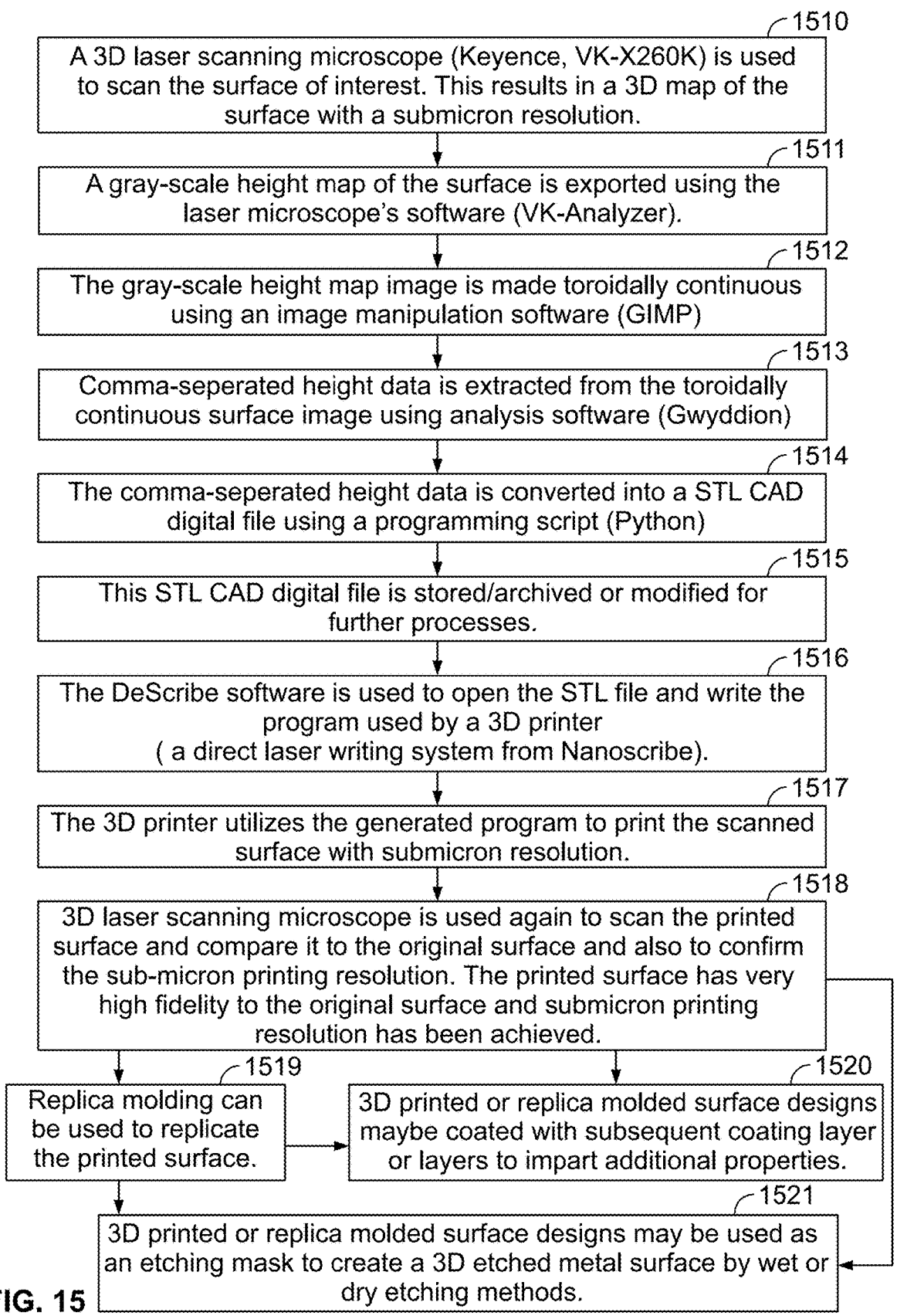
FIG. 15 depicts the process steps of 3D digitization, digital storage, and 3D printing using direct laser writing and replication of 3D surfaces with submicron resolutions for another embodiment of the present invention which involves large area tiling.

One other embodiment of the present invention, process steps of 3D digitization, digital storage, and 3D printing using direct laser writing and replication of 3D surfaces with submicron resolutions, which involves large area tiling is illustrated in FIG. 15. The first step 1510 and the last seven steps 1515-1521 are the same as the first step 110 and last seven steps 113-119 to FIG. 1. The illustrated method that involves large area tiling contains steps 1511-1514 that are different from the steps 111-112 illustrated in FIG. 1.

Current conversion softwares are slow when analyzing the large amounts of data necessary for sub-micron accuracy. They also do not give access to the data during transformation. This illustrated method bypasses conventional software by directly converting a comma-separated file (CSV) of height values (obtained by digital scans of the surface topography) into 3D printable data (STL). This new process allows access to the data and in situ modification.

FIG. 15 depicts the process steps of 3D digitization, digital storage, and 3D printing using direct laser writing and replication of 3D surfaces with submicron resolutions for another embodiment of the present invention which involves large area tiling. Surfaces which are the same or similar everywhere do not need to be completely scanned, as they can be transformed into a toroidally continuous tile which can be used to print surfaces of arbitrary size. These tiles have approximately the same statistical properties as the original, yet are more scalable in terms of the time necessary to acquire, convert, and print replicants. Gray-scale bitmap heightmap images are obtained of the digitally scanned surface, and the GNU Image Manipulation Program (GIMP) is used to modify the images to be toroidally continuous. The software Gwyddion may then be used to convert the modified bitmap images back into CSV data, after which the STL conversion process described above can be utilized to create 3D printable surfaces. Detailed steps of this method are illustrated below.

Figure 16:
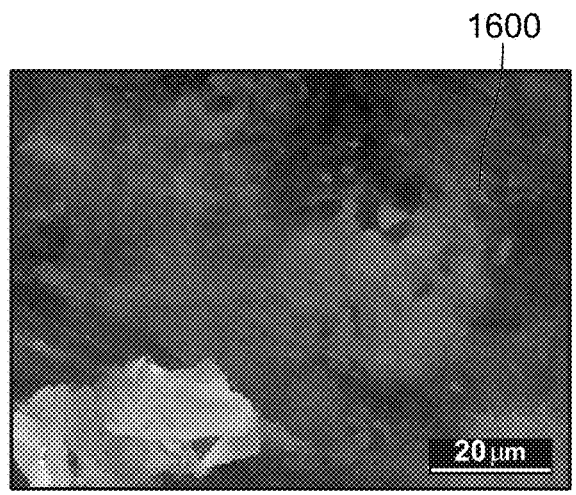
FIG. 16 depicts a detailed scan of the surface of a Moroccan 5 franc coin.

Step 1510 provides a 3D laser scanning microscope, for example Keyence, VK-X260K may be used to scan the surface of interest. This results in a 3D map 1600 of the surface with a submicron resolution as shown in FIG. 16. FIG. 16 illustrates a 3D map 1600 of the scanned surface of a Moroccan 5 franc coin. The scanned 3D map 1600 will later be transformed into a toroidally continuous tile and may be used to print surfaces of arbitrary size. Map 1600 illustrated in FIG. 16 has a scale bar of 20 μm.

Similar to step 110 as illustrated in FIG. 1, the scan process in step 1510 depending on the desired resolution, different lenses can be used for scanning i.e., 20×, 50×, 150×, etc. Depending on the desired quality of the scanned surface topography, standard or superfine measurement modes can be used. Depending on the desired resolution, different scanning Z pitches can be used ranging from 0.01

μm to 50 μm (higher magnification lenses provide finer pitches). The file may be stored with .vk4 extension or other format.

Step 1511 shows the exporting of a gray-scale heightmap of the scanned surface 1600 using the laser microscope's software, for example VK-Analyzer.

Figure 17:
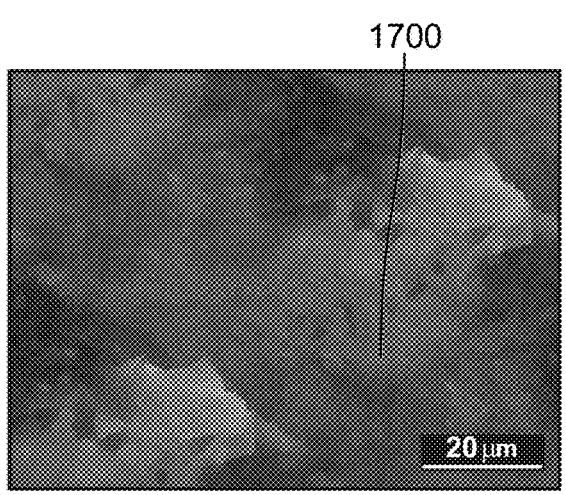
FIG. 17 depicts the toroidally continuous image which results when the tiling process is applied to FIG. 16, preserving local similarity.

The GNU Image Manipulation Program (GIMP) may then be used to make the gray-scale heightmap map image toroidally continuous as illustrated in step 1512. This may also be referred to as the tiling process. FIG. 17 shows the toroidally continuous image 1700 resulted from the tiling process. Image 1700 preserves local similarity of the scanned heightmap 1600. Map 1700 illustrated in FIG. 17 has a scale bar of 20 μm.

An image analysis software, such as Gwyddion, may be used to extract comma-separated height data (CSV) from the toroidally continuous surface image 1700 as illustrated in step 1513. A processor can run a program (may be written in Python for example) to convert the comma-separated height data into an STL CAD digital file, which is 3D printable, as illustrated in step 1514.

Figure 18:
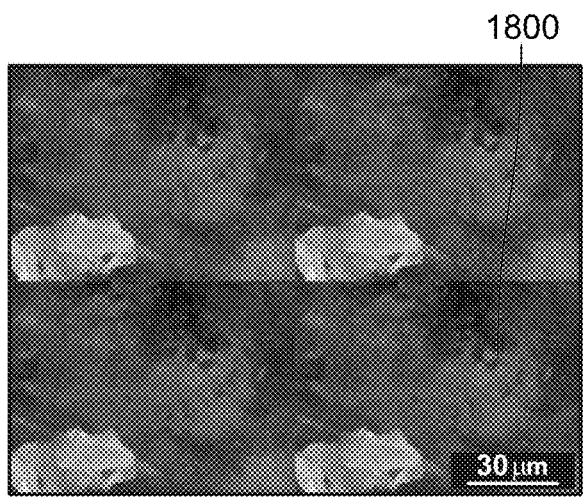
FIG. 18 depicts four tiles of FIG. 16 placed side-by-side. Since
Figure 19:
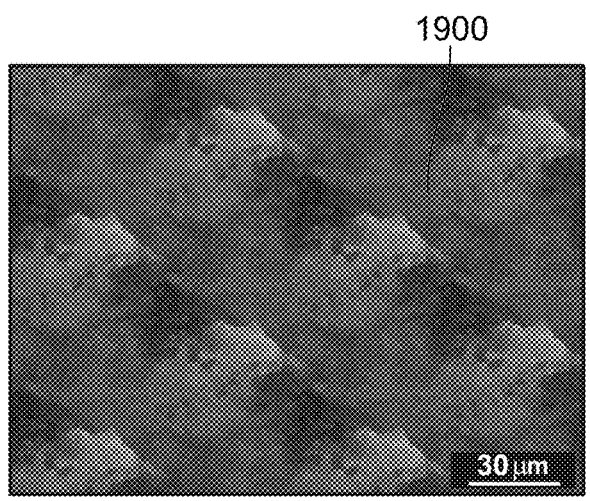
FIG. 19 depicts four tiles of FIG. 17 placed side-by-side. While structures are repeated in the space, there are no discontinuities on the edges, and it is not apparent where the borders of each image is located; the edges have been smoothed.

FIGS. 18 and 19 illustrate the results of four scanned surface 1600 placed side by side (map 1800 as illustrated in FIG. 18) and four processed surface 1700 placed side by side (map 1900 as illustrated in FIG. 19). Because the scanned surface 1600 is not toroidally continuous, there are discontinuities at the edges of the image 1800, as illustrated in FIG. 18. Maps 1800 and 1900 illustrated in FIGS. 18-19 have a scale bar of 30 μm.

While structures are repeated in the space, there are no discontinuities on the edge when the four tiles of processed image 1700 are placed side by side. It is also not apparent where the borders of each image is located, the edges have been smoothed of image 1900, as illustrated in FIG. 19.

Steps 1515-1521 are the same as steps 113-119, as illustrated in FIG. 1 and FIGS. 4-14.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiments, methods, and examples, but by all embodiments and methods within the scope and spirit of the disclosure.

What is claimed is:

1. A method for fabricating surface topography, the method comprising the steps of:
    scanning a surface of interest to generate an original topography of the surface of interest with submicron resolution;
    modifying said original topography to be toroidally continuous; and
    processing said modified toroidally continuous topography to generate a large area tiling surface:
    obtaining a processed file of said large area tiling surface; and providing said processed file to a 3D printer, said 3D printer prints a replica of the surface of interest with submicron resolution.

2. The method of claim 1 further including the step of:
    creating and using an etch mask from the replica, and etching a desired topography into a substrate.

3. The method of claim 2 where in the etching of the desired topography further including the steps of:
    creating an etch mask from said replica; and
    using said etch mask to etch desired topography into said substrate.

4. The method of claim 1 further including the steps of:
    making a molded topography of said replica.

5. The method of claim 1 further including the steps of:
    making a molded topography of said replica;
    adding one or more layers to said molded topography to change at least one feature of said molded topography;
    creating an etch mask from said molded topography; and
    using said etch mask to etch desired topography into said substrate.

6. The method of claim 1 further including the steps of
    adding one or more layers to said replica to change at least one feature of said replica;
    creating an etch mask from said replica; and
    using said etch mask to etch desired topography into said substrate.

7. The method of claim 2 wherein said substrate is an automotive component.

8. The method of claim 2 wherein said substrate is a mechanical surface and said desired topography reduces a break-in period for the mechanical surface.

9. The method of claim 2 wherein said substrate is a mechanical surface and said desired topography reduces the friction on a surface of said mechanical surface.

10. The method of claim 2 wherein said substrate is a mechanical surface and said desired topography increases the oil wettability on a surface of said mechanical surface.

11. The method of claim 2 wherein said substrate is a mechanical surface and said desired topography increases lubrication on a surface of said mechanical surface.

12. The method of claim 2 wherein said substrate is a mechanical surface and said desired topography reduces wear on a surface of said mechanical surface.

* * * * *